United States Patent [19]
Satoh

[11] Patent Number: 5,875,198
[45] Date of Patent: Feb. 23, 1999

[54] SEMICONDUCTOR DEVICE TESTING APPARATUS

[75] Inventor: Kazuhiko Satoh, Gyoda, Japan

[73] Assignee: Advantest Corporation, Tokyo, Japan

[21] Appl. No.: 907,365

[22] Filed: Aug. 7, 1997

[30]    Foreign Application Priority Data

Aug. 8, 1996  [JP]  Japan ..................................... 8-210068

[51] Int. Cl.⁶ ............................ G01R 31/28; G06F 11/00
[52] U.S. Cl. ........................ 371/27.3; 371/22.1; 371/27.1
[58] Field of Search ................................. 371/27.3, 27.1, 371/22.1

[56]             References Cited

U.S. PATENT DOCUMENTS 5,748,124   5/1998  Rosenthal et al. ...................... 341/120

Primary Examiner—Phung M. Chung
Attorney, Agent, or Firm—Staas & Halsey

[57]             ABSTRACT

A semiconductor device testing apparatus is provided which includes an output voltage corrective circuit wherein a test voltage to be applied to a semiconductor under test (DUT) 14 is corrected through digital processing. An offset memory 1, a gain memory 2, an output level register 3, a tester processor 5, a selection register 15, a selector 16, a data register 17, an all-pin data setting sequencer 19, a load controller 20, a digital multiplier 21, and a digital adder 22 are provided in the main frame of the testing apparatus. A multi-channel D/A converter 23 for converting digital serial data from the main frame to analog parallel data for each channel and drivers 13 each for applying the test voltage to one of the pins of the DUT 14 are provided in the test head of the testing apparatus. The offset memory 1 prestores therein offset data contained in correction data and the gain memory gain data also contained in the correction data. The output level register 3 stores therein the test voltage to be applied to the pin of the DUT for each channel.

10 Claims, 12 Drawing Sheets

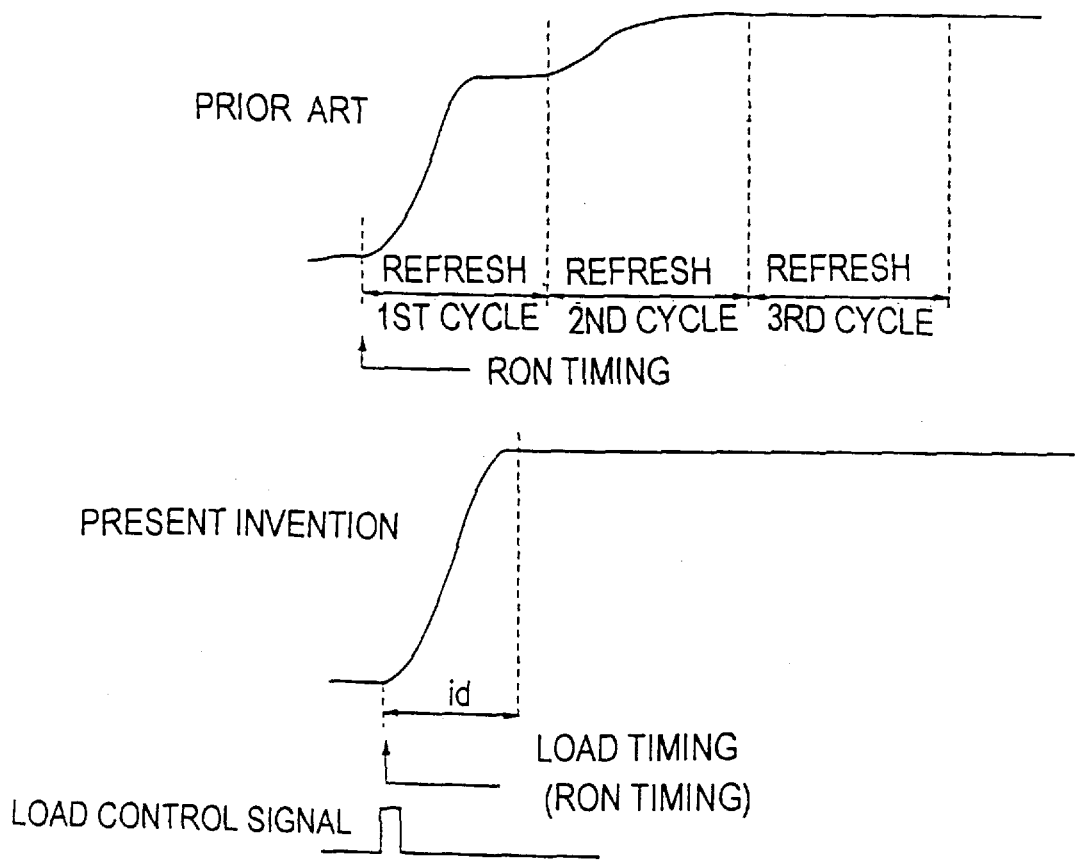

SEMICONDUCTOR DEVICE TESTING APPARATUS

BACKGROUND OF THE INVENTION

1. Field of the Invention

The present invention relates to a semiconductor device testing apparatus suitable for testing semiconductor devices such as semiconductor integrated circuits, and more particularly, to a semiconductor device testing apparatus having an output voltage corrective circuit of the type that corrects, by digital processing, a voltage of a test signal to be applied to a semiconductor device under test (semiconductor device under test, commonly called DUT) and outputs the corrected voltage.

2. Description of the Related Art

A semiconductor device testing apparatus (commonly called an IC tester) for testing a semiconductor device, specifically, a semiconductor integrated circuit (hereinafter referred to as IC) which is a typical example of semiconductor devices, has in its body (commonly called main frame) a various kinds of circuits of the testing apparatus that generate a test signal of a predetermined pattern to be applied to an IC to be tested (IC under test), an address signal, a control signal and so forth for application to the IC under test, and receive and process response signals from the IC under test to measure their electric characteristics. A test head (commonly called pin electronics) of the testing apparatus, which applies the test signal of a predetermined pattern, the address signal, the control signal and so forth to the IC under test, and receives response signals therefrom, is placed at a distance from the main frame (for example, at a test section of a semiconductor device transporting and handling apparatus commonly called handler which transports a semiconductor device for testing, and handles or processes the tested semiconductor device on the basis of the test results). The test head has a socket mounted thereto, with which the IC is brought into electrical contact when a predetermined test is performed.

While the semiconductor device testing apparatus will hereinbelow be described as being applied to testing of ICs which are a typical example of semiconductor devices for brevity of description, it is needless to say that the semiconductor device testing apparatus of this kind can be used to test other semiconductor devices than IC as well.

As is well known in the art, an IC to be tested has a number of terminals (leads) or pins and the semiconductor device testing apparatus (hereinafter referred to as IC tester) carries out testing of the IC by applying a test signal of a predetermined pattern to each of the pins of the IC under test (DUT). To this end, the IC tester and each pin of the DUT (in practice, each terminal of the socket to which the DUT is mounted) are electrically connected to each other via an independent or separate electrical path (including a circuit or circuits). Usually, the path between the IC tester and each pin of the DUT is called a channel.

The voltage of a test signal, which is applied to each of the pins of a DUT, often differs from the voltage value set in the IC tester due to variations in the characteristics, values, or the like of individual elements forming respective paths, or owing to various other causes. Hence, it is necessary that voltages of test signals to be applied to the pins of a DUT be corrected in compensation for variations or the like in respective paths.

An example of this kind of prior IC tester is illustrated in FIGS. 9 and 10. FIG. 9 shows the configuration of the pertinent part of the circuits of the IC tester housed in its main frame, and FIG. 10 shows a test head of the IC tester and an IC under test (DUT).

As shown in FIG. 9, the IC tester of this example has in its main frame an offset memory 1, a gain memory 2, a plurality of RON output level registers 3, an output level selection register 4, a tester processor 5, a first, a second and a third digital-to-analog (D/A) converters 6, 7 and 8, a selector 9, an analog selector 10, a refresh capacitor 11, a plurality of RON/ROF selection register 15, an RON/ROF selector 16, an ROF data register 17, and a refresh sequencer 18.

As depicted in FIG. 10, there is provided in the test head a driver 13 for applying a test signal to each of the pins of a DUT 14. Although only one driver 13 is shown in FIG. 10, the number of such drivers is equal to the number of pins of the DUT 14, and accordingly, the number of channels. The main frame and the test head are electrically connected via cables 12 (only one cable 12 is shown in FIG. 10, but the number of such cables is equal to the number of channels), and the output voltage from each driver 13 is applied to the corresponding pin of the DUT 14 via a cable and an IC socket not shown.

In the offset memory 1 there is prestored (previously stored) offset data contained in data that is used to compensate for variations of the channels to the respective pins of the DUT. In the gain memory 2 there is prestored gain data also contained in the immediately mentioned data. These offset and gain data will be described later on.

The number of RON output level registers 3 used is set to the same number as that of several kinds of independent voltage values of test signals to be applied to DUTs, and the voltages of different values are stored in the corresponding RON output level registers, respectively. When only one kind of voltage value, for example, 3 V is applied to the DUTs, one RON output level register may suffice to test them. In general, however, a plurality of RON output level registers are provided so that a required kinds of set voltage values can be stored in selected ones among them, respectively. Thus, the voltage values corresponding in number to the RON output level registers 3 can be set. Since the illustrated example is provided with eight RON output level registers 3, it is possible to set up to eight independent voltage values to be applied to the DUTs. These voltage values are set by a test program.

The output level selection register 4 stores therein select information for determining which voltage value among the voltage values stored in the RON output level registers 3 is to be allocated to the corresponding one of the pins of each DUT, and accordingly the channels thereto. The RON/ROF selection registers 15 each store therein select information for determining whether to output the set voltage stored in the corresponding RON output level register 3 (an RON state) or to output the set voltage stored in the ROF data register 17 (an ROF state). Accordingly, the number of RON/ROF selection registers 15 is the same as that of the RON output level registers 3. Since in this example eight RON output level registers 3 are provided, the number of RON/ROF selection registers 15 used is also eight. These select information stored in the selection registers 4 and 15 are set by the test program.

What is meant by the term "RON state" is to turn on (ON) the voltage set in the RON output level register 3, that is, refers to an operation by which the voltage set in the RON output level register 3 is outputted therefrom. The term "ROF state" is intended to refer to an operation by which the voltage set in the RON output register 3 is turned off (OFF) and 0 V of the initial voltage value is outputted from the ROF data register 17.

The tester processor 5 is a central processing unit (CPU) which exerts centralized control over the whole IC tester 5 including peripheral equipment, and it responds to instructions of the test program to provide predetermined data, voltages and select information to the offset memory 1, the gain memory 2, the RON output level registers 3, the output level selection register 4, and the RON/ROF selection registers 15.

The ROF data register 17 stores therein 0 V as a fixed value that is a set voltage outputted in the ROF state.

The refresh sequencer 18 generates a sequence of serial data generation and processing, and sequentially controls the offset memory 1, the gain memory 2, and the output level selection register 4.

The refresh sequencer 18 is always in operation since the voltage corrected for each channel to be applied to the corresponding one of the pins of the DUT 14 needs to be charged in the refresh capacitor 11 in each channel at all times. The offset memory 1, the gain memory 2 and the output level selection register 4 operate in accordance with the sequence generated by the refresh sequencer 18 and sequentially output respective signal data for each channel. The offset data prestored in the offset memory 1 and the gain data prestored in the gain memory 2 are inputted into the first D/A converter 6 and the second D/A converter 7 where they are converted into analog data, respectively. The output from the second D/A converter 7 is inputted via an amplifier amp2 into a terminal vref (reference voltage terminal) of the third D/A converter 8 to correct its reference voltage vref, namely, its gain.

Either the output data of each RON output level register 3 which is the test signal to be fed to the DUT 14 or the output data of the ROF data register 17 with the fixed voltage of 0 V stored therein is selected by the RON/ROF selector 16 in response to a select signal that is provided thereto from the corresponding RON/ROF selection register 15. The voltage data selected by the RON/ROF selector 16 is fed to the selector 9. Responding to a select signal fed thereto from the output level selection register 4, the selector 9 selects the channel over which the received voltage data is to be sent. In this way, the RON/ROF voltage data for each channel specified by the test program is outputted from the selector 9. This voltage data is inputted into the third D/A converter 8 where it is converted into analog data.

The analog voltage data outputted from the first D/A converter 6 is provided via an amplifier amp1 to an inverting input terminal of another amplifier amp3 subsequent thereto and the analog voltage data outputted from the third D/A converter 8 is provided to a non-inverting input terminal of the amplifier amp3, wherein they are added to each other or subtracted one from the other in analog form. The output from the amplifier amp3 is inputted as corrected analog voltage data into the analog selector 10 which converts the inputted serial data to parallel data corresponding to the individual channels and outputs a corrected analog voltage to each channel.

It is arranged that the analog voltage outputted from the analog selector 10 charges the refresh capacitor 11 in each channel, which holds it while a different channel is being selected.

Since the main frame and the test head are electrically connected via the cables 12 as mentioned previously, the voltage charged in the refresh capacitor 11 of each channel is amplified by an amplifier amp4 and then applied via the associated cable 12 to the corresponding driver 13 provided in the test head. The output of each driver 13 is connected to the corresponding terminal of an IC socket (not shown) mounted on the test head. Therefore, when the DUT 14 is brought into electrical contact with the IC socket, the output voltage is applied as a test voltage to each pin of the DUT 14 from the driver 13 corresponding thereto.

It is most desirable that the above-described voltage generator circuit (including the driver 13) of each channel, which generates the voltage for test to be applied to the DUT, be configured so that its output voltage characteristic with respect to the voltage value set in the corresponding RON output level register 3 (the output voltage characteristic of the driver 13) offers or exhibits a linear equation of the coefficient 1. Though linear circuit elements are used as circuit elements forming the respective voltage generator circuits of respective channels, in practice, there are many cases that each voltage generator circuit (driver 13) does not necessarily exhibits its output voltage characteristic which is represented by a linear equation of the coefficient 1 with respect to the set voltage due to variations in circuit elements, or owing to various other causes. Therefore, by merely setting the applied voltage to the DUT or the driver output voltage, the output voltage of each voltage generator circuit can seldom come to the set value. For this reason, it is customary in the art to always correct the set voltage outputted from the RON output level register 3 so that the output voltage characteristic of the voltage generator circuit of each channel exhibits a linear equation of the coefficient 1 and thereafter a test for DUTs is performed by applying the corrected voltage for test to the DUTS.

This will be described below in more detail. If the relationship between the output voltage of the voltage generator circuit of each channel, that is, the output voltage Y of the driver 13 at the last stage and the set voltage X of, the RON output level register 3 exhibits the following linear equation $$X=Y$$

then the output voltage characteristic of the voltage generator circuit of each channel will come to the linear equation of the coefficient 1 as indicated by the solid line in FIG. 8. As a result, the proper output voltage can be obtained from the driver by merely setting the driver output voltage. Practically, in most instances, however, the relationship between the output voltage Y of the driver 13 at the last stage and the set voltage X exhibits the following linear equation $$Y=BX+C$$

as indicated by the broken line in FIG. 8 owing to variations in the circuit elements used or various other causes. In the above, B is a coefficient and C is a constant. For example, when the set voltage is 3 V, the output voltage of 3 V will be obtained with respect to the set voltage of 3 V if the driver 13 has such an output voltage characteristic as indicated by the solid line in FIG. 8. Since the actual driver output voltage characteristic will become Y=BX+C due to the differences in characteristic, value or the like between the circuit elements or for some other reasons, an output voltage of only 2.5 V or so, for instance, can be obtained. It is therefore necessary to make corrections in which the coefficient B becomes 1 and the constant C becomes 0 so as to obtain the output voltage of 3 V.

Even if the voltage generator circuits of respective channels have exactly the same circuit configuration, the values of the coefficient B and the constant C often differ between channels due to the variation in the circuit elements used or owing to various other causes. Therefore, corrections of the values of the coefficient B and the constant C must be made for each channel so that an output voltage of each channel becomes the set voltage. The offset data prestored in the offset memory 1, which is contained in the data for compensating for the variations of the circuit elements of each channel, corresponds to the above-mentioned constant C, and the gain data prestored in the gain memory 2 corresponds to the above-mentioned coefficient B.

Next, a description will be given of a method for correcting the driver output voltage in a conventional IC tester of the above configuration.

First, the RON output level registers 3 are put in the ROF state and the zero volt set in the ROF data register 17 is selected and provided via the analog selector 10 to the corresponding channel. The output voltage from the driver 13 of the test head at this time is measured. This measured value is used as offset data (C in the equation of the broken line in FIG. 8), and hence it is stored in the offset memory 1. Next, the RON output level registers 3 are put in the RON state and an arbitrary set voltage is selected and provided via the analog selector 10 to the same channel. The output voltage from the driver 13 of the test head at this time is also measured. Based on the ideal value in this case (an arbitrary set voltage) and the measured value, gain data is calculated by the test processor 5 so that the set voltage is obtained from the driver 13. The gain data thus obtained is stored in the gain memory 2.

Since the gain and offset data are unique or inherent values of each pin of the DUT, the above operation is repeated for each channel and the offset data of each channel is stored in the offset memory 1 and the gain data in the gain memory 2, respectively.

During testing the offset memory 1, the gain memory 2 and the output level selection register 4 are sequentially controlled by the refresh sequencer 18. The gain memory 2 is thus accessed, from which the corrected gain data is fed via the second D/A converter 7 and the amplifier amp2 to the terminal vref of the third D/A converter 8 to set its reference voltage Vref based on the corrected gain data. By this, the reference voltage Vref of the third D/A converter 8 (and consequently the slope of the output voltage characteristic in FIG. 8) is altered in an analog quantity. The corrected offset data is read out of the offset memory 1 and fed via the first D/A converter 6 and the amplifier amp1 to the amplifier amp3 for analog addition to or subtraction from the corrected set analog voltage that is provided from the third D/A converter 8.

Output voltages thus corrected by analog processing for all channels CH1 to CHn are sequentially outputted from the analog selector 10, then the refresh capacitors 11 of all the channels are charged one after another, and the charged voltages are supplied to the drivers 13 of the test head for application to the respective pins of the DUT.

FIG. 11 is a timing chart showing the operation sequence described above. In this example, three kinds of voltages of 3 V (HIN1), 2 V (HIN2) and 1 V (HIN3) are set in three of the output level registers 3, respectively, and the set voltages are selected by a test program in the order of 3 V→1 V→2 V→3 V →. . . 3 V→1 V→2 V→3 V for the channels CH1 through CHn. Further, this example shows the case that select information is inputted into the RON/ROF selection registers 15 from the test program so as to select the set voltages of 3 V (HIN1) and 2 V (HIN2) and so as not to select the set voltage of 1 V (HIN3) and hence so as to select ROF (0 V). Thus, the set voltages are outputted from the analog selector 10 to the channels CH1 through CHn in the order of 3 V→0 V→2 V→3 V→ . . . 3 V→0 V→2 V→3 V.

Since the conventional IC tester has a construction which charges and holds the corrected output voltage in the refresh capacitor 11, a refresh circuit is naturally needed to hold the voltage. The refresh circuit is always in operation during testing the operation of the DUT, and hence there is a drawback that the refresh circuit interferes with other circuits of the IC tester, which results in deterioration of the accuracy of the test for the operation of the DUT.

Another problem of the prior art lies in that charging the refresh capacitor 11 is time-consuming since it has a time constant. On this account, as indicated by the waveform in the prior art shown in FIG. 12(A), the refresh capacitor 11 is not charged up to the set voltage level on only a single charge over one refresh cycle period during the RON/ROF state, and hence it has a drawback that its settling time is long. That is, it requires much time for the charged voltage of the refresh capacitor 11 to reach the set voltage level and become stable, and hence there is a disadvantage that the time duration of the test is lengthy.

Further, since the refresh circuit charges the capacitors 11 of the respective channels in a sequential order (i.e. serially), charged voltages in all the channels do not rise up at the same timing and a time delay occurs for each channel. The time delay from the time point that the capacitor of the first channel is fully charged to the time point that the capacitor of the last channel is fully charged increasing more and more as the number of channels is increased. When the time delay is increased, it is difficult to simultaneously apply test signals (voltages for test) to all the pins of the DUT with a predetermined delay after the application of the power supply voltage to the DUT. As will be understood from the waveform in the prior art shown in FIG. 7(A), after the application of the power supply voltage to the DUT, the channel CH1 rises up after a time interval tb has passed, but a time interval tc is required until the channel CHn rises up after the channel CH1 has risen. For this reason, it is difficult to simultaneously apply voltage signals for test to all the pins of the DUT unless the time delay of tc is given. As stated above, the time delay tc is increasing more and more as the number of channels is increased. Accordingly, since every IC is supplied with voltages its all terminal pins at the same time in its actual use, there is a disadvantage that the test corresponding to the actual use of an IC cannot be performed.

Another disadvantage of the conventional IC tester is that a large-scale corrective circuit must be used for correcting the set voltages because the set voltages are corrected through analog processing. Since it is hard to place such a large-scale circuit in the test head of a multi-channel configuration, it is general practice in the prior art to connect the main frame and the test head via a large number of cables for the transmission of voltage signals. This requires a cable for each channel, and hence the large amount of cables must be used.

Besides, if it is wanted to test a DUT with a different set voltage applied to a particular one or more of the pins of the DUT from the remaining pins thereof, it is necessary in the prior art to alter or modify the test program since a distinct independent setting cannot be made. Accordingly, this is time-consuming and troublesome.

SUMMARY OF THE INVENTION

It is therefore an object of the present invention to provide a semiconductor device testing apparatus which is free from the above-described problems of the prior art.

Another object of the present invention is to provide a semiconductor device testing apparatus having an output voltage corrective circuit for correcting the set voltage of a test signal to be applied to a semiconductor device under test through digital processing.

In a first aspect of the present invention, there is provided a semiconductor device testing apparatus comprising: an output level register for storing therein the voltage of a voltage signal per channel to be applied to a semiconductor device to be tested; a correction data memory for previously storing therein correction data per channel which is used to correct variations of each channel so that the voltage of a voltage signal to be applied to a semiconductor device under test comes to equal to the voltage of the voltage signal from the output level register; digital operation means for processing the voltage of the voltage signal per channel from the output level register and the correction data per channel from the correction data memory through digital operation and outputting the result of the digital operation as a corrected voltage of the voltage signal per channel to a corresponding channel; a multi-channel digital-to-analog converter for converting a serial digital voltages transmitted thereto via a first signal transmission means from the digital operation means into parallel analog voltages corresponding to each channel; a load controller for supplying via a second signal transmission means to the multi-channel digital-to-analog converter a load control signal for controlling the timing when the parallel analog voltages are outputted from the multi-channel digital-to-analog converter; and driver means for applying the parallel analog voltages from the multi-channel digital-to-analog converters to a semiconductor device under test, the number of the driver means being equal to that of the channels used.

In a preferred first embodiment, the correction data previously stored in the correction data memory is data which is used to correct a first-order coefficient and a constant of the output voltage characteristic of each driver means according to a linear equation. Also, the correction data previously stored in the correction data memory is previously acquired by digital operation for each channel by means of an initialization program prior to testing of a semiconductor device to be tested and is stored in the correction data memory.

The correction data memory comprises an offset memory for previously storing therein offset data contained in the correction data, and a gain memory for previously storing therein gain data contained in the correction data, the offset data corresponding to the constant and the gain data corresponding to the first-order coefficient, and the digital operation means comprises a digital multiplier for multiplying a gain data from the gain memory and a signal voltage from the output level register, and a digital adder for adding the result of multiplication from the digital multiplier and an offset data from the offset memory together or subtracting one from the other.

The semiconductor device testing apparatus according to the first embodiment includes, in its main frame, the offset memory, the gain memory, the output level register, the load controller, the digital multiplier, the digital adder, a tester processor which exerts centralized control over the whole testing apparatus including peripheral equipment, a data register for storing therein zero volt (0 V) as a fixed value, a selection register for storing therein select information that is used to select, for each channel, whether to output a voltage set in the output level register or to output the zero volt set in the data register, a selector for selecting the output from either the output level register or the data register in response to the select information supplied from the selection register, and an all-pin data setting sequencer for sequentially setting data for all channels are included in the main frame of the testing apparatus, and includes, in its test head, the multi-channel digital-to-analog converter and the driver means the number of which is equal to that of the channels used. The main frame and the test head are interconnected by the first and the second signal transmission means.

In a preferred second embodiment, the correction data previously stored in the correction data memory is data that is used to correct a second-order coefficient, a first-order coefficient, and a constant of the output voltage characteristic of each driver means according to a quadratic equation. Also, the correction data previously stored in the correction data memory is previously acquired by digital operation for each channel by means of an initialization program prior to testing of a semiconductor device to be tested and is stored in the correction data memory.

The correction data memory comprises an offset memory for previously storing therein offset data corresponding to the constant which is contained in the correction data, a second-order coefficient gain memory for previously storing therein gain data corresponding to the second-order coefficient which is contained in the correction data, and a first-order gain memory for previously storing therein gain data corresponding to the first-order coefficient which is contained in the correction data, and the digital operation means comprises a first digital multiplier for multiplying a gain data from the second-order coefficient gain memory and a signal voltage from the output level register, a first digital adder for adding the result of multiplication from the first digital multiplier and a gain data from the first-order coefficient gain memory together or subtracting one from the other, a second digital multiplier for multiplying the signal voltage from the output level register which is supplied to the first digital multiplier and the result of addition/subtraction from the first digital adder, and a second digital adder for adding the result of multiplication from the second digital multiplier and an offset data from the offset memory together or subtracting one from the other.

The semiconductor device testing apparatus according to the second embodiment includes, in its main frame, the offset memory, the first-order coefficient gain memory, the second-order coefficient gain memory, the output level register, the load controller, the first digital multiplier, the second digital multiplier, the first digital adder, the second digital adder, a tester processor which exerts centralized control over the whole testing apparatus including peripheral equipment, a data register for storing therein zero volt (0 V) as a fixed value, a selection register for storing therein select information that is used to select, for each channel, whether to output a voltage set in the output level register or to output the zero volt set in the data register, a selector for selecting the output from either the output level register or the data register in response to the select information supplied from the selection register, and an all-pin data setting sequencer for sequentially setting data for all channels are included in the main frame of the testing apparatus, and includes, in its test head, the multi-channel digital-to-analog converter and the driver means the number of which is equal to that of the channels used are included in the test head of the testing apparatus. The main frame and the test head are interconnected by the first and the second signal transmission means.

BRIEF DESCRIPTION OF THE DRAWINGS

FIG. 1 is a block diagram illustrating the circuit configuration in a main frame of a second embodiment of the semiconductor device testing apparatus according to the present invention;

FIGS. 12(A–B) are timing charts for comparison of the settling time during the RON state between the conventional semiconductor device testing apparatus and the apparatus of the present invention.

DETAILED DESCRIPTION OF THE PREFERRED EMBODIMENTS

Figure 1:
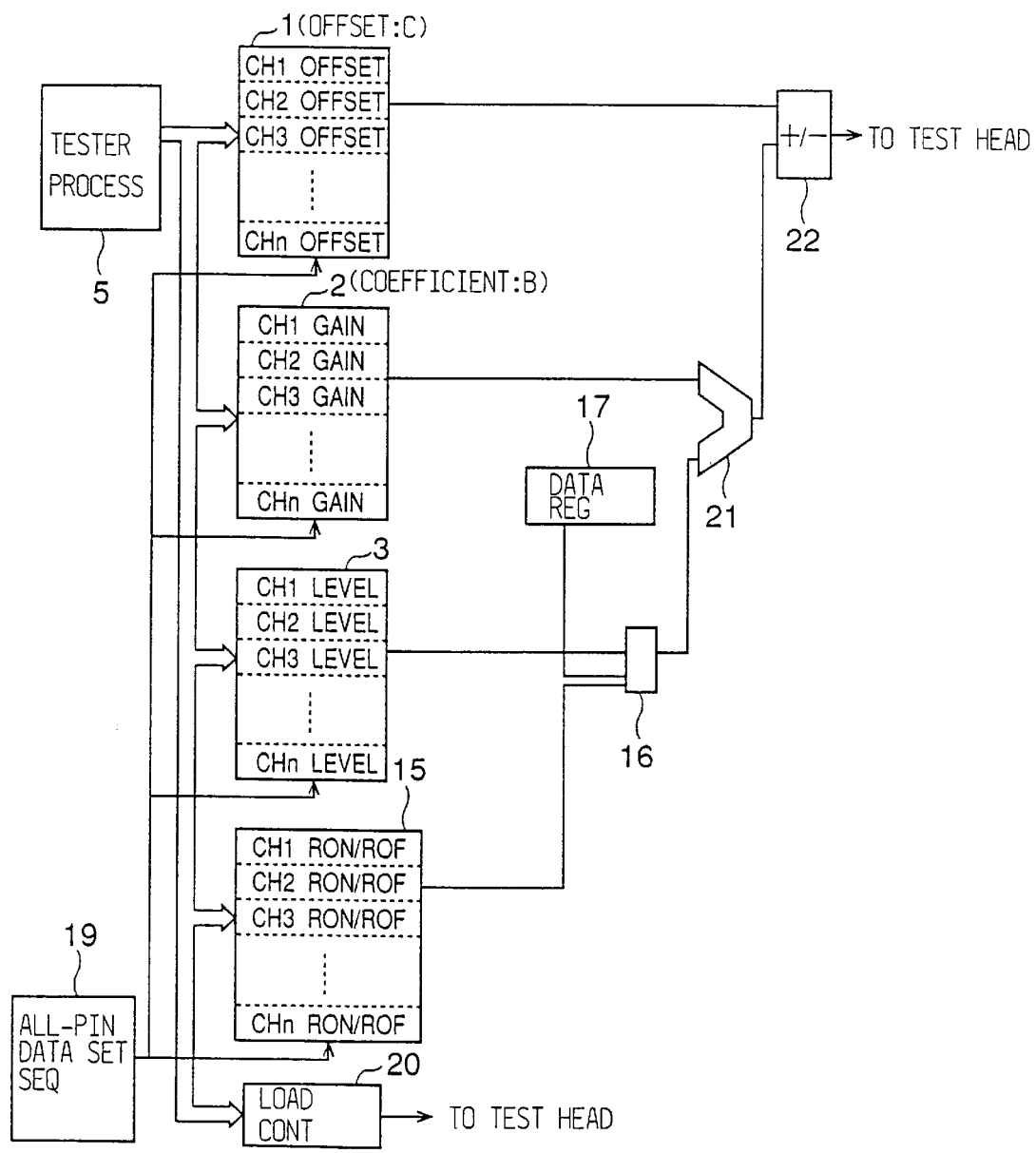
FIG. 1 is a block diagram illustrating the circuit configuration in a main frame of a first embodiment of the semiconductor device testing apparatus according to the present invention.
Figure 2:
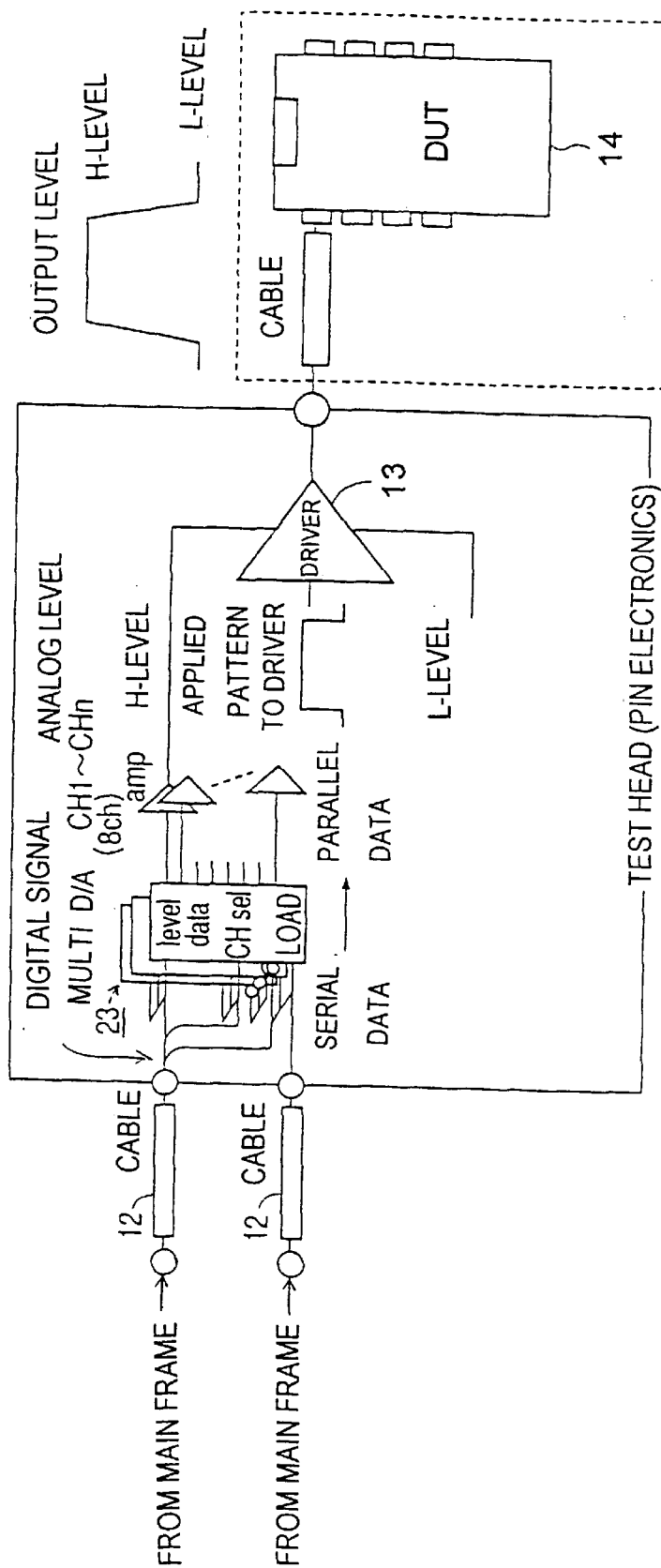
FIG. 2 is a block diagram illustrating the circuit configuration in a test head of the first embodiment of the semiconductor device testing apparatus according to the present invention.

Referring first to FIGS. 1 and 2, a first embodiment of the semiconductor device testing apparatus (hereinafter referred to as IC tester) according to the present invention will be described in detail.

FIG. 1 illustrates in block form the circuit configuration in the main frame of the first embodiment of the present invention and FIG. 2 illustrates the circuit configuration in the test head together with a DUT. The IC tester of the first embodiment comprises, in its main frame, an offset memory 1, a gain memory 2, an RON output level register 3, a tester processor 5, an RON/ROF selection register 15, an RON/ROF selector 16, an ROF data register 17, an all-pin data setting sequencer 19, a load controller 20, a digital multiplier 21, and a digital adder 22.

As shown in FIG. 2, there are provided in the test head a multi-channel D/A converter 23 for converting serial digital data supplied from the main frame into analog parallel data for each channel and drivers 13 each for applying a voltage signal for test to corresponding one of the pins of a DUT 14. The number of such drivers 13 is equal to the number of the pins of the DUT 14 and consequently the number of channels used although only one driver 13 is shown in FIG. 2. The main frame and the test head are interconnected via cables 12, and the output voltage from each driver 13 is applied to the corresponding pin of the DUT 14 via a cable and an IC socket not shown.

As is the case with the conventional IC tester described previously, the offset memory 1 prestores therein offset data contained in the data that is used to compensate for variations of each pin of the DUT 14 and the gain memory 2 prestores therein gain data contained in the immediately mentioned data. In the RON output level register 3 there is stored for each channel the signal voltage to be applied to each pin of the DUT 14. The signal voltage can be set independently for each channel under the control of a test program.

In the RON/ROF selection register 15 there is stored, for each channel, select information for selecting whether to output signal voltage set in the RON output register 3 or to output the ROF voltage (0 V) in the ROF register 17. The select information is also set independently for each channel under the control of the test program. In the ROF data register 17 there is stored zero volt (0 V), as a fixed value, that is a set voltage to be outputted when the ROF state is selected.

The tester processor 5 is a central processing unit (CPU) which exerts centralized control over the whole IC tester including peripheral equipment. Responsive to instructions of the test program, the tester processor 5 provides predetermined data, voltages and select information to the offset memory 1, the gain memory 2, the RON output level register 3, the RON/ROF selection register 15, and the load controller 20.

The all-pin data setting sequencer 19 is one that sequentially sets data for all pins of the DUT, and it generates a sequence of serial data generation and processing of computation or operation and sequentially controls the offset memory 1, the gain memory 2, the RON output level register 3, and the RON/ROF selection register 15.

The selection of either the signal voltage RON from the RON output level register 3 or the voltage ROF (0 V) from the ROF data register 17 is carried out by the RON/ROF selector 16 in response to a select signal from the RON/ROF selection register 15.

Figure 8:
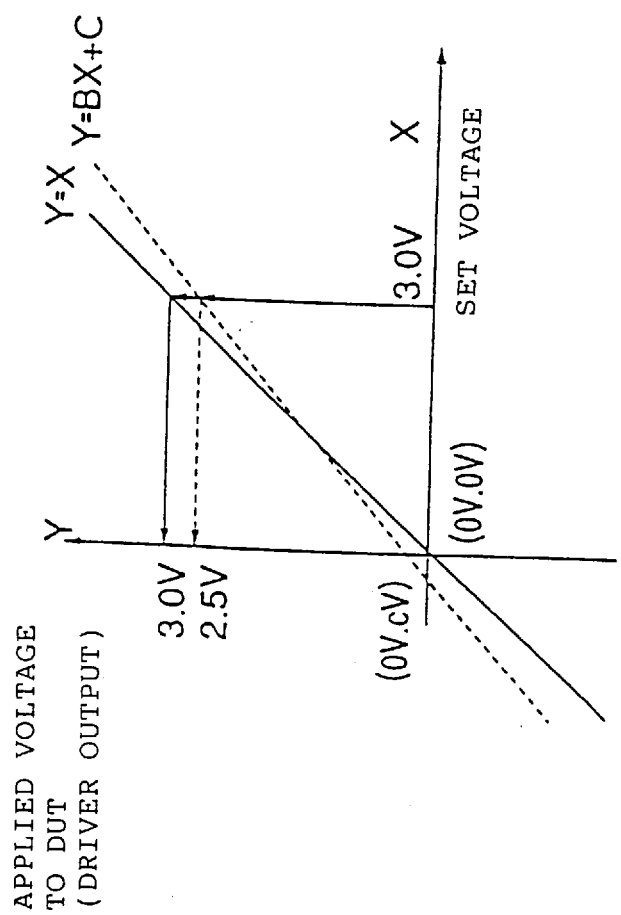
FIG. 8 is a characteristic diagram for explaining the output voltage characteristic of the semiconductor device testing apparatus.
Figure 9:
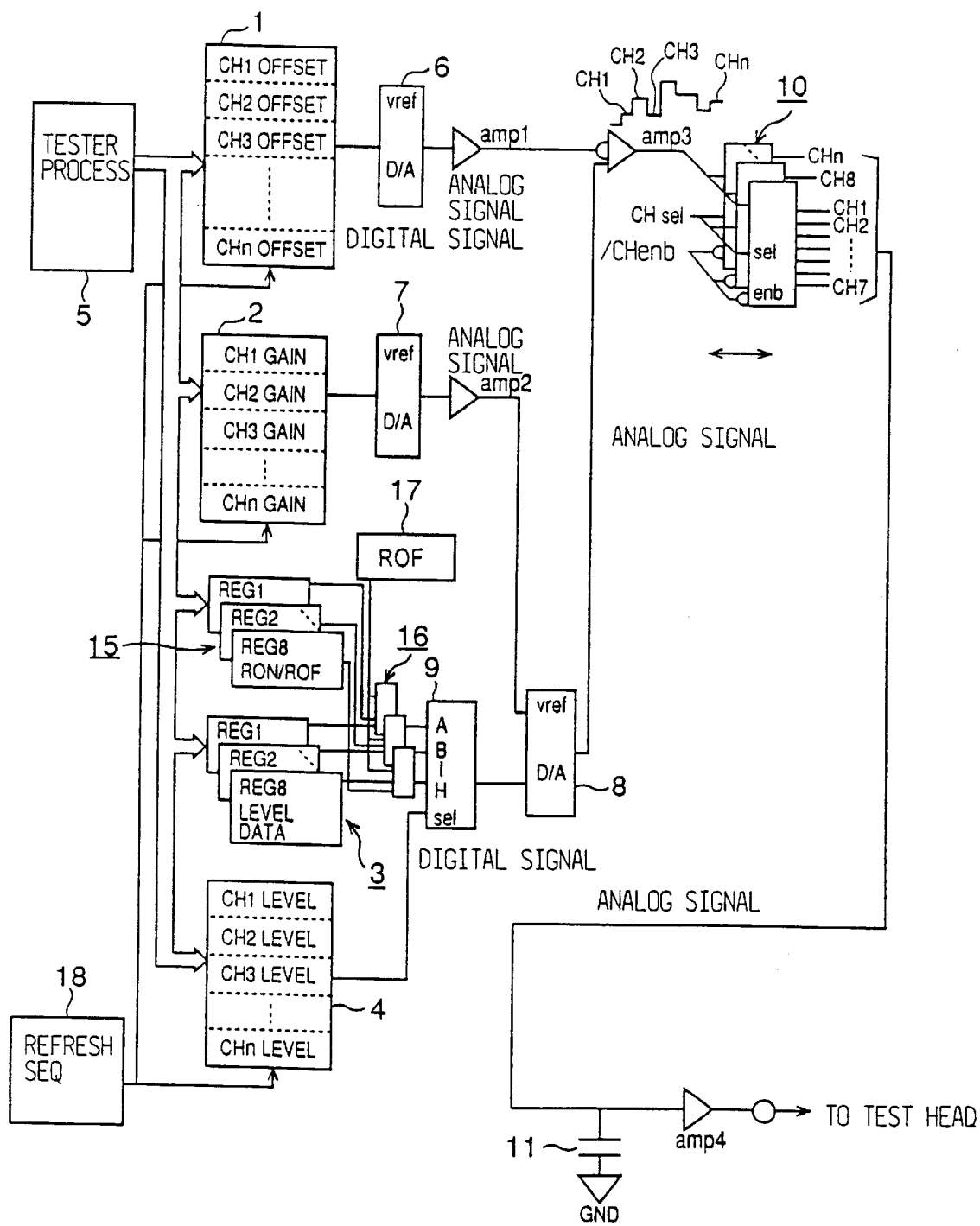
FIG. 9 is a block diagram showing an example of the circuit configuration in the main frame of the conventional semiconductor device testing apparatus.
Figure 10:
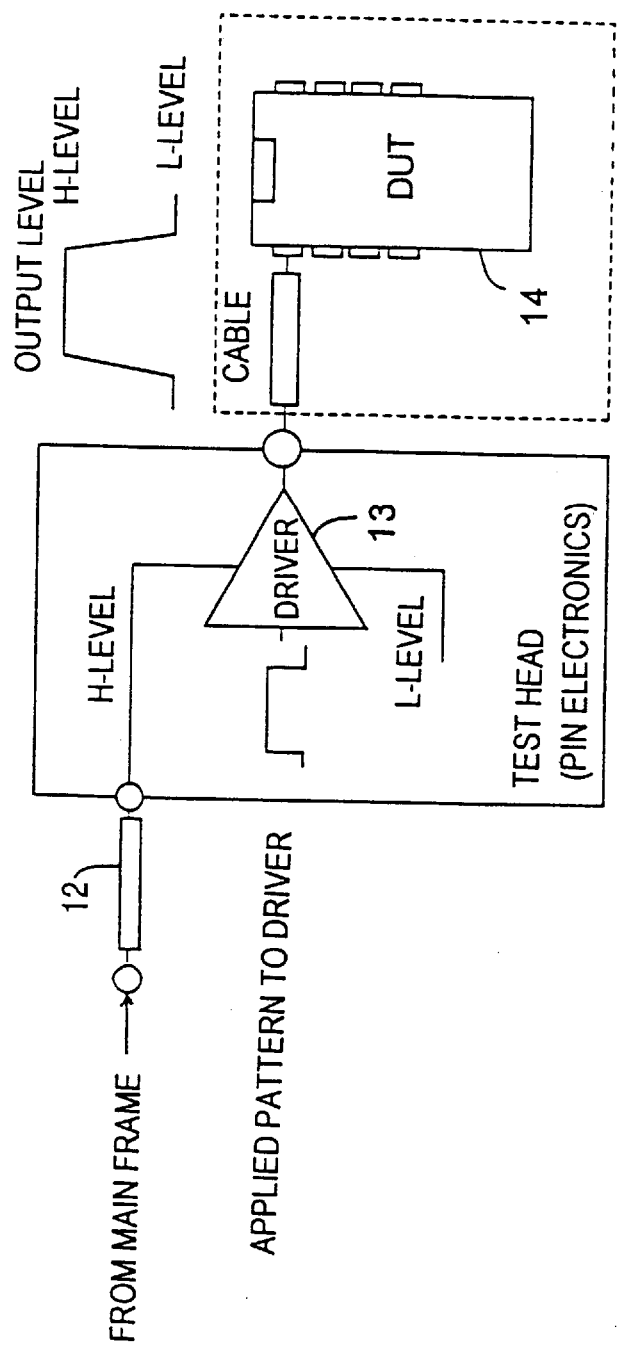
FIG. 10 is a block diagram showing an example of the circuit configuration in the test of the conventional semiconductor device testing apparatus.
Figure 11:
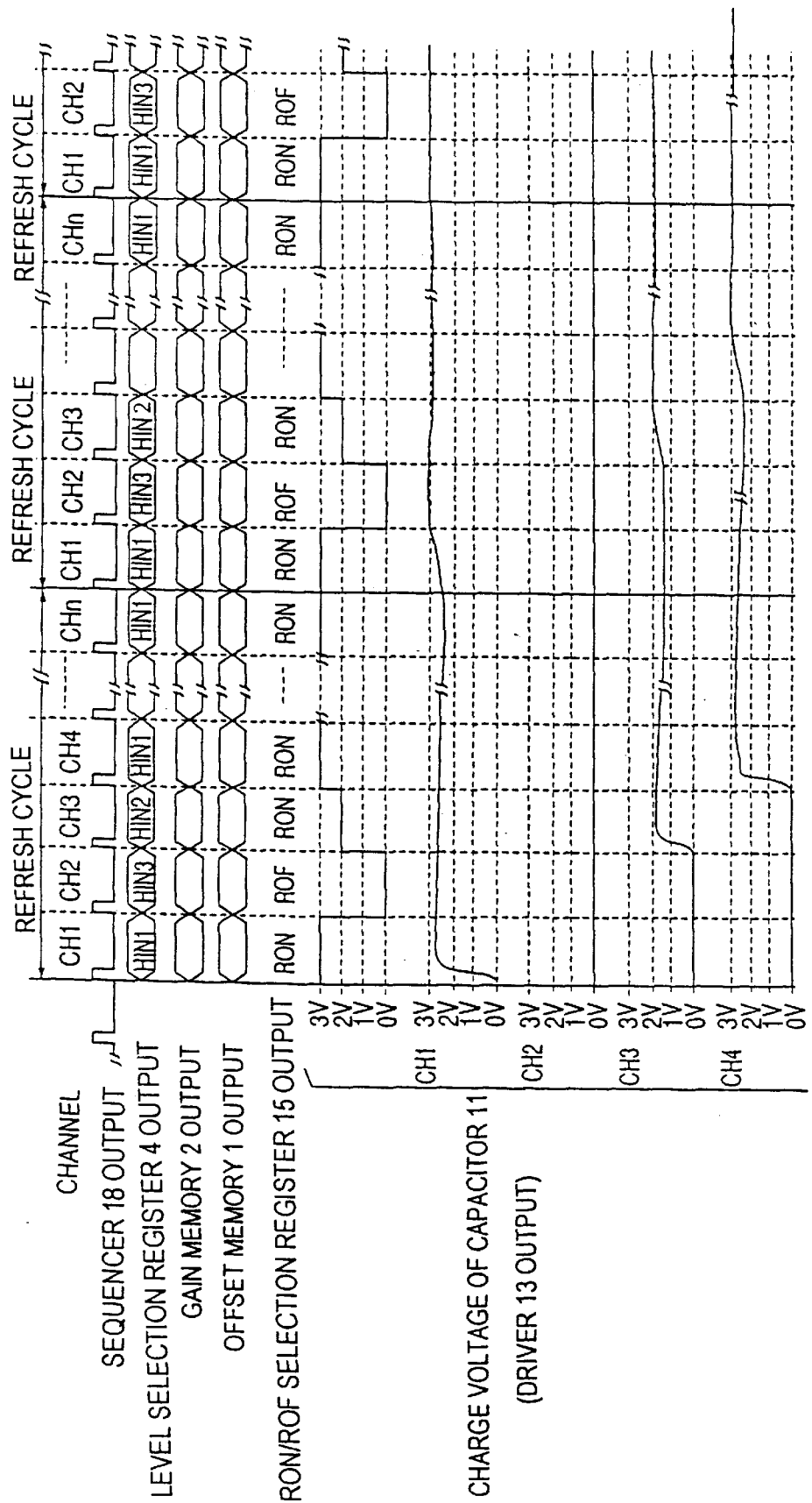
FIG. 11 is a timing chart for explaining the operation of the conventional semiconductor device testing apparatus depicted in FIGS. 9 and 10.

The signal voltage RON thus selected is multiplied in the digital multiplier 21 by the gain data from the gain memory 2, by which the slope (the coefficient B) of the output voltage characteristic shown in FIG. 8 is corrected. Then, the output voltage of the digital multiplier 21 is fed to the digital adder 22 wherein it and the offset data from the offset memory 2 are added together or subtracted one from the other. By this, an offset value (the constant C) of the output voltage characteristic shown in FIG. 8 is corrected. In this way, the correction of (BX+C) is made through digital computation or operation.

The result of calculation by the digital adder 22 is input via the cable 12 into the multi-channel D/A converter 23 where it is converted from the digital serial data to parallel analog data for each channel. Each of the parallel analog voltages generated by the D/A converter 23 is applied to the driver 13 of each channel. The driver 13 has its output connected via a cable to the corresponding terminal of an IC socket (not shown) mounted on the test head. Thus, the output voltage from each driver 13 is applied as a test voltage to one of the pins of the DUT 14 when the DUT 14 is mounted on the IC socket.

The timing when the test voltage is applied to the DUT 14 is controlled by a load control signal which is generated by the load controller 20 in the main frame and supplied via the cable 12 to a load terminal LOAD of the multi-channel D/A converter 23 in the test head.

Next, a description will be made of a method for correcting the output voltage from the driver 13 in the IC tester of the above-described embodiment.

To previously acquire the offset data and the gain data for each channel that are stored in the offset memory 1 and the gain memory 2, respectively, an initialization program is created separately of the test program. The initialization program starts with setting of two different voltages of arbitrary values (3 V and 2 V or 3 V and 1 V, for instance) in the RON output level register 3 for each channel, followed by applying a first one of the two set voltages to the driver 13 from the RON output level register 3 via the channel and measuring the output voltage from the driver 13, then by similarly applying the second set voltage to the driver 13 from the RON output level register 3 via the same channel and measuring the output voltage from the driver 13, and by calculating the coefficient B (gain data) and the constant C (offset data) in Y=BX+C from the measured values and the set values of the two voltages through the use of the tester processor 5.

Since the thus obtained gain and offset data are inherent values of each pin of the DUT, the above operation is performed for each channel under the control of the initialization program and the offset and gain data for each channel are stored for each channel in the offset memory 1 and the gain memory 2, respectively.

During testing, the offset memory 1, the gain memory 2, the RON output level register 3 and the RON/ROF selection register 15 are sequentially controlled by the all-pin data setting sequencer 19 to output therefrom the data stored therein for each channel. The set voltage output from the output level register 3 is input into the multiplier 21, wherein its level is digitally corrected by the gain data read out of the gain memory 2, and the thus digitally corrected set voltage is provided to the digital adder 22, wherein its offset value is digitally corrected by the offset data read out of the offset memory 1. The output from the digital adder 22 is provided to the multi-channel D/A converter 23 of the test head over the cable 12.

In this way, output voltages corrected through digital processing in all the channels CH1 through CHn are sequentially outputted from the digital adder 22 and supplied to the multi-channel D/A converter 23 of the test head, wherein they are converted from digital serial data into parallel analog data for each channel. The analog voltages generated by the multi-channel D/A converter 23 are supplied to the drivers 13 of the respective channels, from which they are applied to the individual pins of the DUT 14.

This embodiment is arranged such that the load controller 20 generates and applies the load control signal to each load terminal LOAD of the multi-channel D/A converter 23 after the sequential application thereto of the corrected voltages from the digital adder 22 in the individual channels CH1 through CHn. Therefore, the multi-channel D/A converter 23 does not output the parallel analog signal voltages before the load control signal is supplied to the D/A converter 23. Upon application of the load control signal to the multi-channel D/A converter 23, the parallel analog signal voltages are simultaneously applied via the individual amplifiers amp to the drivers 13 of the respective channels, from which test voltages are applied to the respective pins of the DUT 14 at the same time.

Figure 3:
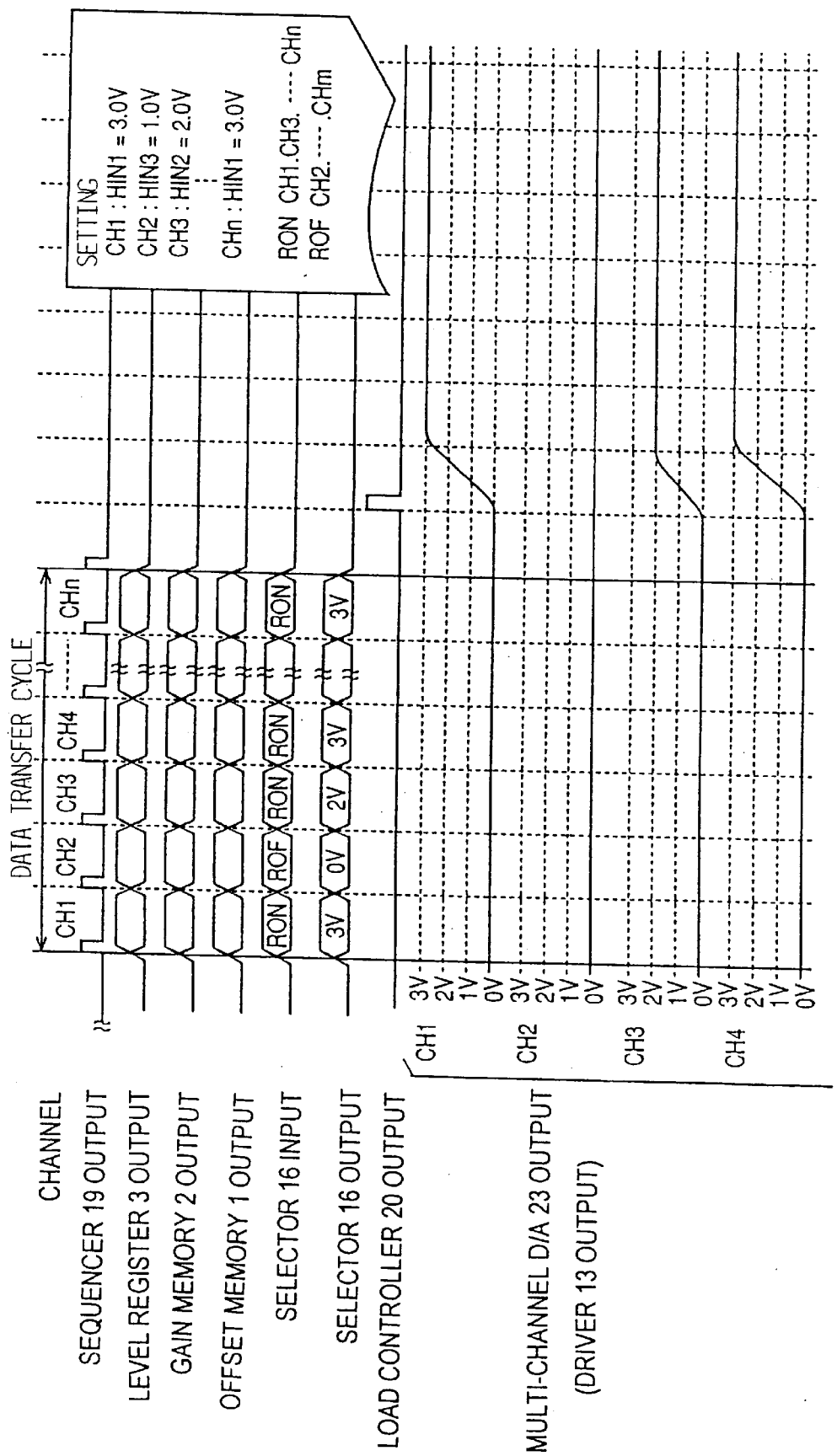
FIG. 3 is a timing chart for explaining the operation of the first embodiment of the present invention depicted in FIGS. 1 and 2.

FIG. 3 is a timing chart showing the sequence of operation described above. In this example, the case is shown that voltages are set by the test program in the output level register 3 in the order of 3 V (HIN1)→1 V (HINJ)→2 V (HIN2)→3 V→. . . →3 V for the channels CH1→CH2→CH3→CH4→. . . →CHn. Further, the case is shown that select information of RON/ROF is inputted into the RON/ROF selection register 15 from the test program in the order of RON→ROF→RON→RON→. . . →RON in correspondence with the channels CHI→CH2→CH3→CH4→. . . →CHn so that the set voltages of 3 volts (HIN1) and 2 volts (HIN2) are selected and HOF (0 V) is selected instead of selection of the set voltage of 1 volt (HIN3).

It will be seen from FIG. 3 that upon application of the load control signal to the multi-channel D/A converter 23, the parallel analog signal voltages of the respective channels (except the channel or channels outputting 0 V) simultaneously rise up and are applied to the respective pins of the DUT 14 at the same time.

Figure 4:
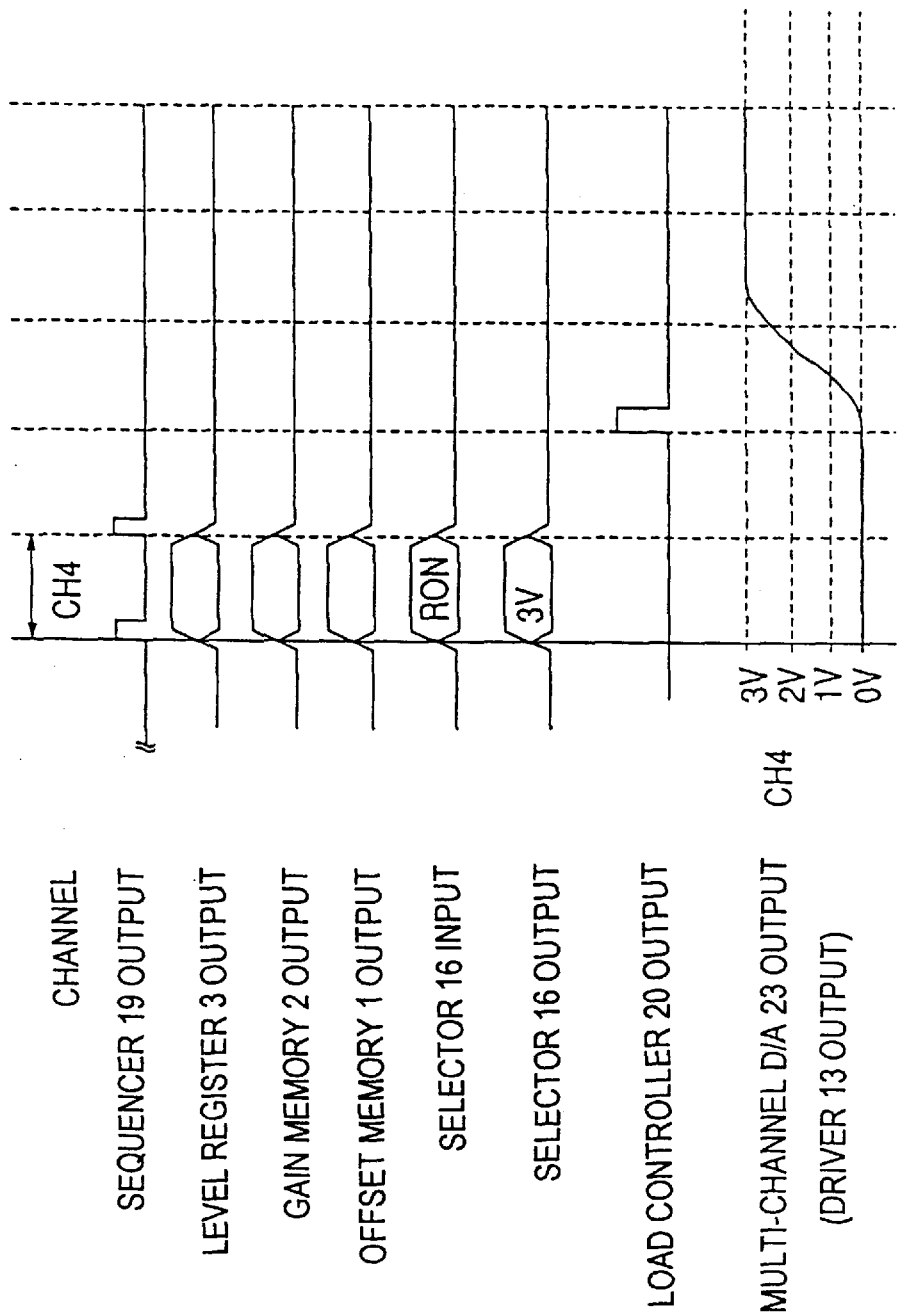
FIG. 4 is a timing chart, similar to FIG. 3, for explaining the operation of the first embodiment of the present invention depicted in FIGS. 1 and 2.

FIG. 4 is a timing chart showing the data transfer cycle of the fourth channel CH4 in FIG. 3.

As described above, during the execution of a test (when the set voltage is outputted), the signal voltages in the respective channels, which are to be provided to the multi-channel D/A converter 23, are calculated in real time and simultaneously corrected by the digital computing circuit (including the digital multiplier 21 and the digital adder 22) that calculates Y=BX+C, after which they are simultaneously applied to the D/A converter 23. Since this digital calculating or operating circuit operates only during the calculation and correction of the set voltage in each channel and does not operate when the test voltage is applied to the DUT 14 to measure the operating characteristic thereof, there is no possibility that the digital calculating circuit interferes with other circuits of the IC tester, which results in the deterioration of the accuracy of the test for the DUT.

Another advantage of this embodiment over the prior art is the reduction of the settling time. Since the multi-channel D/A converter 23, when supplied with the load control signal, directly outputs the test voltage for application to the DUT 14, the voltage rises immediately after the application of the load control signal (after a slight time interval of id has passed) as indicated by the waveform shown in FIG. 12(B), and hence the settling time is short (depending on the performance of the D/A converter 23). Consequently, the voltage level becomes stable in a shorter time than the prior art, shortening the testing time accordingly.

Figure 7:
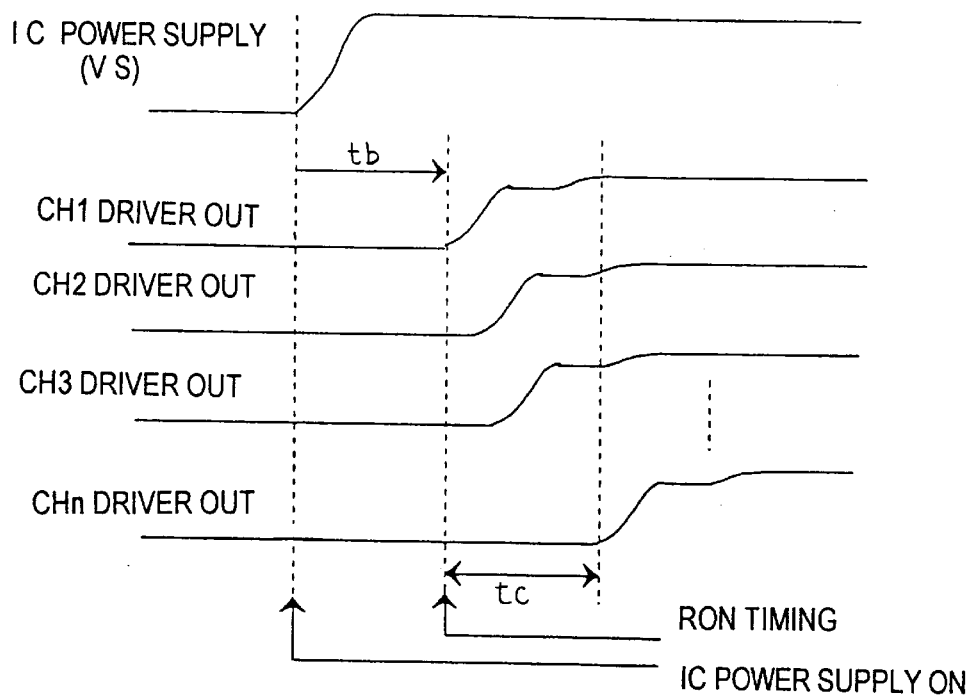
FIGS. 7(A–B) are timing charts for comparison of RON timing in a conventional semiconductor device testing apparatus and the apparatus of the present invention.
Figure 7:
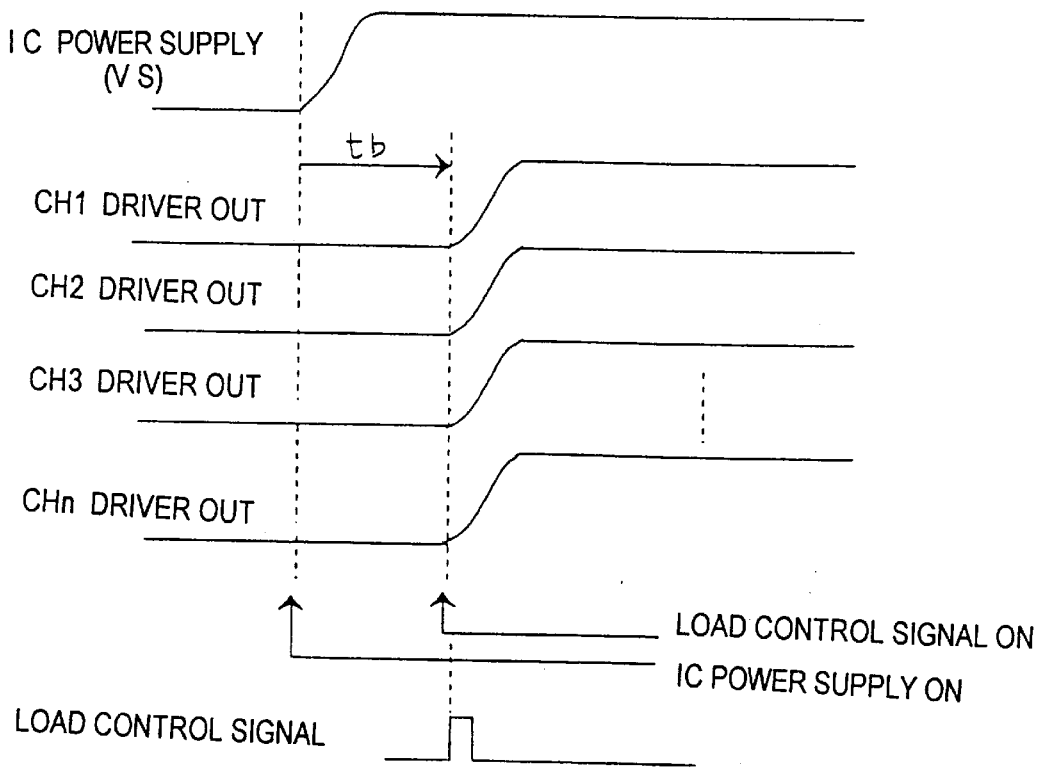

Another advantage is that the timing when the signal voltage is applied to the DUT 14 can easily be controlled by the load control signal since the multi-channel D/A converter 23 responds thereto to directly output the test signal, Accordingly, as indicated by the waveform shown in FIG. 7(B), after the application of the power supply voltage to the DUT 14, test signal voltages can simultaneously be applied to the DUT 14 by supplying load control signals to the respective channels of the multi-channel D/A converter 23 at the same time after the time interval of tb has passed. Since every DUT is supplied with voltages its all terminal pins at the same time in its actual use, the test corresponding to the actual use of a DUT can be performed.

Furthermore, since the IC tester of this embodiment corrects the set voltages through digital processing as described above, the output voltage corrective circuit is so small in scale that it can be placed in the test head of the multi-channel configuration. The main frame needs only to send digital signals (only set data and control signals) to the test head. This reduces the amount of cables connecting between the main frame and the test head ($\frac{1}{10}$ of that in the prior art) and provides another advantage that the digital signal is immune to external noise unlike the analog signal.

Besides, since the voltage to be applied to each pin of the DUT 14 is set in the output level register 3 independently for each channel, the voltage can easily be set at a desired value for each channel in the test program so that the DUT 14 can be tested with the voltage to be applied to a particular one or more of the pins set at a value different from that for the remaining pins.

Figure 5:
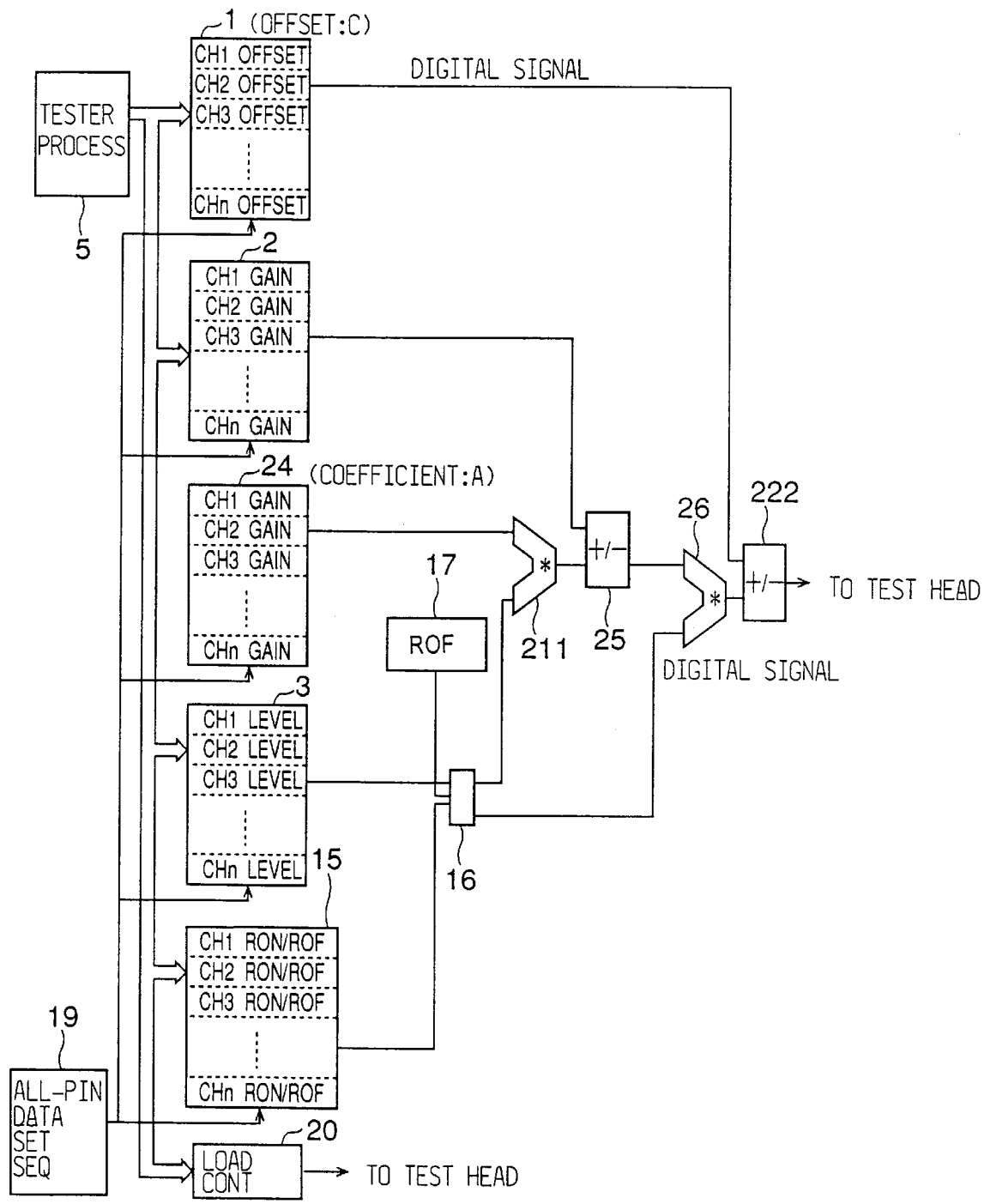
FIG. 5 is a block diagram

The first embodiment of the present invention has been described above to make a first-order correction of the set voltage to be applied to the DUT. Turning next to FIG. 5, a second embodiment of the invention will be described which makes a second-order correction of the set voltage. The second embodiment will be described on the assumption that the relationship of the characteristic of the driver output voltage Y to the set voltage X is given by the following quadratic equation:

$$Y=(AX+B)X+C$$

It is needless to say, however, that the present invention is also applicable when the driver output voltage characteristic exhibits a relationship of a different quadratic equation to the set voltage.

FIG. 5 illustrates in block form the circuit configuration in the main frame of the second embodiment of the present invention. The IC tester of this embodiment comprises, in its main frame, an offset memory 1, a first-order coefficient gain memory 2, an RON output level register 3, a tester processor 5, an RON/ROF selection register 15, an RON/ROF selector 16, an ROF data register 17, an all-pin data setting sequencer 19, a load controller 20, a first digital multiplier 211, a first digital adder 25, a second digital multiplier 26, a second digital adder 222, and a second-order coefficient gain memory 24.

Since the offset memory 1, the first-order coefficient gain memory 2, the RON output level register 3, the tester processor 5, the RON/ROF selection register 15, the RON/ROF selector 16, the ROF data register 17, the all-pin data setting sequencer 19, and the load controller 20, all placed in the main frame, may be identical in construction and function with those of the first embodiment shown in FIG. 1, no description will be repeated unless necessary. In the first-order coefficient gain memory 2 there is prestored gain data on the first-order coefficient (B) contained in the data that is used to compensate for variations of the respective pins of a DUT. In addition, the configuration in the test head is identical with that of the first embodiment depicted in FIG. 2, and hence it is not shown and the description thereof will not be given again.

In the second-order coefficient gain memory 24 in the main frame, there is prestored gain data about the second-order coefficient (A) contained in the data that is used to compensate for variations of the respective pins of a DUT.

The signal voltage RON, selected by the RON/ROF selector 16, is fed to the first digital multiplier 211, wherein it is multiplied by the second-order coefficient gain data fed from the second-order coefficient gain memory 24. By this, the second-order coefficient A of the output voltage characteristic of the driver 13 is corrected. The multiplied output from the first digital multiplier 211 is provided to the first digital adder 25, wherein it and the first-order coefficient gain data from the first-order coefficient gain memory 2 are added together or subtracted one from the other. By this, the first-order coefficient B of the output voltage characteristic of the driver 13 is corrected. In this way, the correction of $(AX+B)$ is made through digital computation.

The added or subtracted output from the first digital adder 25 is fed to the second digital multiplier 26, wherein it is multiplied by the signal voltage RON selected by the RON/ROF selector 16. By this, $\{(AX+B)X\}$ is digitally computed. The computed output from the second digital multiplier 26 is provided to the second digital adder 222, wherein it and the offset data from the offset memory 1 are added together or subtracted one from the other, by which the offset value (the constant C) of the output voltage characteristic of the driver 13 is corrected. In this way, a digital computation of $\{(AX+B)X+C\}$ is carried out.

The result of computation by the digital adder 222 is sent over the cable 12 to the multi-channel D/A converter 23 in the test head, wherein it is converted from the digital serial data to parallel analog data for each channel. The parallel analog voltages generated by the multi-channel D/A converter 23 are applied as test voltages to the pins of the DUT 14 via the drivers 13 of the respective channels upon application of the load control signal from the load controller 20 in the main frame to the load terminal LOAD of the multi-channel D/A converter 23 over the cable 12.

Thus, the timing when the test voltage is applied to the DUT 14 is controlled by the load control signal which is generated by the load controller 20 in the main frame and supplied via the cable 12 to the load terminal LOAD of the multi-channel D/A converter 23 in the test head.

Since a method for correcting the driver output voltage in the IC tester of this second embodiment as constructed above is the same as that used in the first embodiment, no description will be repeated. Further, as will be easily understood from the above, during testing, the offset memory 1, the first-order coefficient gain memory 2, the second-order coefficient gain memory 24, the RON output level register 3 and the RON/ROF selection register 15 are sequentially controlled by the all-pin data setting sequencer 19 to output therefrom the data stored therein for each channel, and the set voltage provided from the output level register 3 is corrected through digital processing and sent to the multi-channel D/A converter 23 in the test head. Therefore, the detailed description thereof will be omitted here.

This embodiment is also configured such that the load controller 20 generates and applies the load control signal to each load terminal LOAD of the multi-channel D/A converter 23 after the sequential application thereto of the corrected voltages from the digital adder 22 in all the channels CH1 through CHn. Hence, the multi-channel D/A converter 23 does not output the parallel analog signal voltages until after it receives the load control signal. Also in this embodiment, upon receiving the load control signal, the multi-channel D/A converter 23 applies the parallel analog signal voltages via the individual amplifiers amp to the drivers 13 of the respective channels at the same time, from which test voltages are simultaneously applied to the respective pins of the DUT 14.

Since it is evident that the second embodiment of the above configuration produces the same effects as those obtainable with the first embodiment, no description will be given in this respect.

Figure 6:
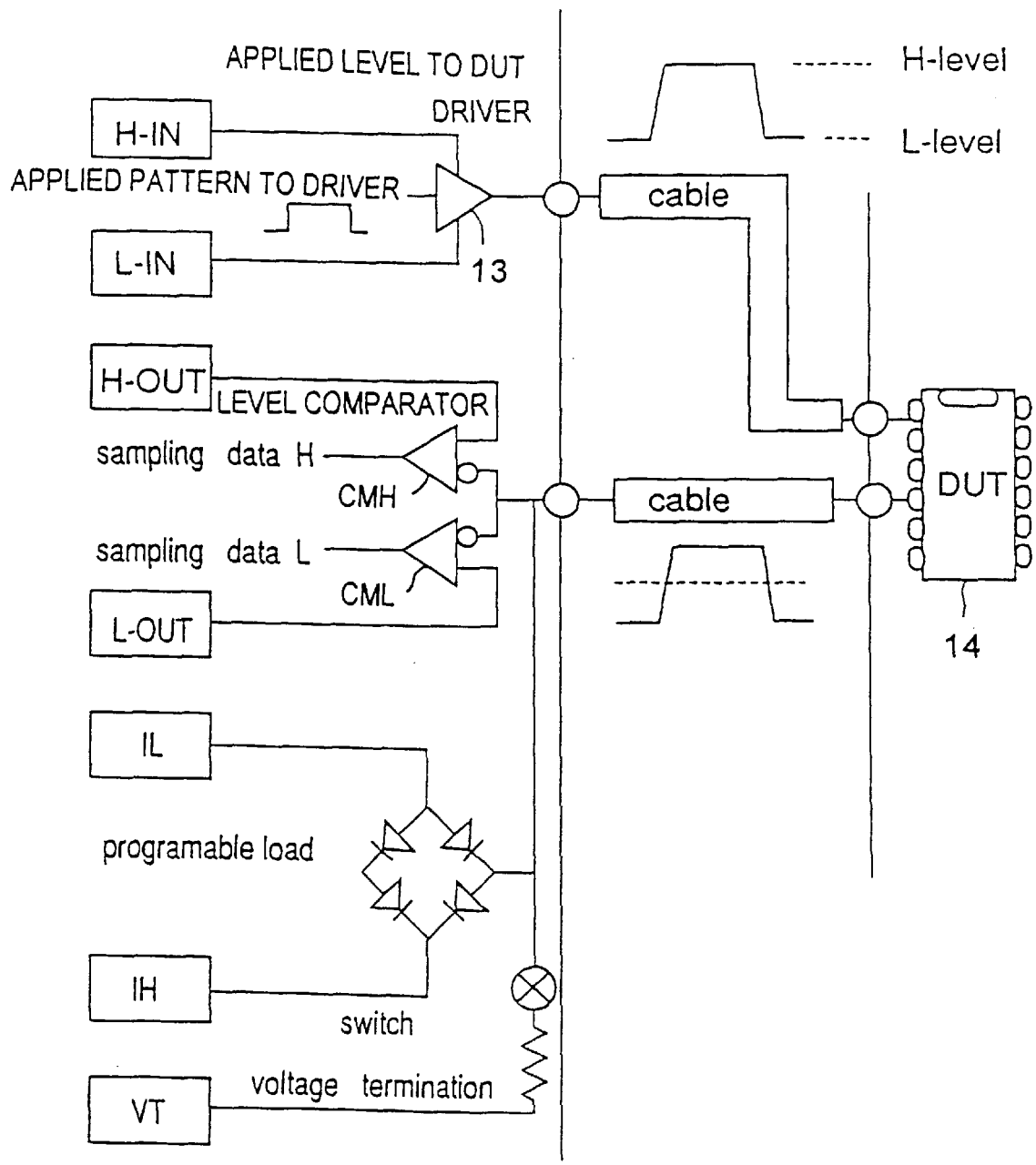
FIG. 6 is a block diagram showing an example of the circuit configuration of semiconductor device testing apparatus to which the present invention is applicable.

FIG. 6 is a block diagram showing a part of the circuit configuration of the IC tester to which the present invention is applicable. The IC tester applies a test signal voltage from the driver 13 of the test head via the cable 12 to each pin of the DUT 14 and receives therefrom a response signal via a cable. The driver 13 is connected a high logical level (hereinafter referred to as H-level) voltage generator circuit H-IN for supplying thereto a H-level signal voltage and a low logical level (hereinafter referred to as L-level) voltage generator circuit L-IN for supplying thereto a L-level signal voltage. The driver 13 applies either one of the H- and L-level voltages to the corresponding pin of the DUT 14. The response signal from the DUT 14 is fed to an H-level or L-level comparator CMH or CML, wherein it is compared with a reference voltage from an H-level or L-level reference voltage generator circuit H-OUT or L-OUT and from which H-level or L-level sampling data is outputted. This sampling data is used to determine whether the DUT is defective (failure) or non-defective (pass).

Accordingly, the output voltage corrective circuit in the first and second embodiments of the present invention can be applied to the H-level voltage generator circuit H-IN, the L-level voltage generator circuit L-IN, the H-level reference voltage generator circuit H-OUT, or the L-level reference voltage generator circuit L-OUT, each of which is provided with a voltage generating section.

It is also possible to apply the output voltage corrective circuit in the first and second embodiments of the present invention to L-level and H-level constant currant sources IL and IH of a programmable load and a power supply VT for a terminator (terminal resistor).

While the first embodiment shows one example of taut cases in which the first-order correction is performed and the second embodiment shows one example of the cases in which the second-order correction is performed, respectively, it is apparent that the present invention is not limited specifically thereto and is also applicable to the cases in which other first-order and second-order corrections are performed. Moreover, it is needless to say that the present invention is not limited to the cases in which the first-order and the second-order corrections are made, and can be also applied to the cases in which the third-order and the fourth-order corrections are performed and further higher order corrections are performed by simply adding some elements.

Although in the above the present invention has been described as being applied to the IC tester for testing ICs which are a typical example of semiconductor devices, it is a matter of course that the present invention is also applicable to semiconductor device testing apparatus for testing other semiconductor devices than ICs.

As is evident from the above, according to the present invention, the digital calculating circuit operates only during the calculation and correction of the set voltage in each channel and does not operate when the test voltage is applied to the DUT and its operating characteristic is measured. This removes the drawback of the prior art that the digital calculating circuit interferes with other circuits of the IC tester and hence deteriorates the accuracy of the test accordingly.

Further, since the multi-channel D/A converter, when supplied with the load control signal, directly outputs the test voltage for application to the DUT, the voltage rises immediately after the application of the load control signal; hence, the settling time is short. This reduces the time for the voltage level to become stable and hence shortens the testing time.

Moreover, the timing for applying the signal voltage to the DUT can easily be controlled by the load control signal since the multi-channel D/A converter responds thereto to directly output the test signal. Hence, test signal voltages can simultaneously be applied to the DUT after the application thereto of the power-supply voltage. Therefore, the DUT can be tested under the actual operating conditions.

Furthermore, since the set voltages are corrected through digital processing, the output voltage corrective circuit is so small in scale that it can be placed in the test head of the multi-channel configuration. The main frame needs only to send digital signals to the test head, and this appreciably reduces the amount of cables connecting between the main frame and the test head and also provides an additional advantage that the digital signal is immune to external noise unlike the analog signal.

Besides, since the voltage to be applied to each pin of the DUT 14 can easily be set at a desired value for each channel in the test program, the DUT can be tested with the voltage to be applied to a particular one or more of the pins set at a value different from that for the remaining pins.

It will be apparent that many modifications and variations may be effected without departing from the scope of the novel concepts of the present invention.

What is claimed is:

1. A semiconductor device testing apparatus comprising:
   an output level register for storing therein the voltage of a voltage signal per channel to be applied to a semiconductor device to be tested;
   a correction data memory for previously storing therein correction data per channel which is used to correct variations of each channel so that the voltage of a voltage signal to be applied to a semiconductor device under test comes to equal to the voltage of the voltage signal from said output level register;
   digital operation means for processing the voltage of the voltage signal per channel from said output level register and said correction data per channel from said correction data memory through digital operation and outputting the result of the digital operation as a corrected voltage of the voltage signal per channel to a corresponding channel;
   a multi-channel digital-to-analog converter for converting a serial digital voltages transmitted thereto via a first signal transmission means from said digital operation means into parallel analog voltages corresponding to each channel;
   a load controller for supplying via a second signal transmission means to said multi-channel digital-to-analog converter a load control signal for controlling the timing when said parallel analog voltages are outputted from said multi-channel digital-to-analog converter; and
   driver means for applying said parallel analog voltages from said multi-channel digital-to-analog converters to a semiconductor device under test, the number of said driver means being equal to that of the channels used.

2. The testing apparatus according to claim 1, wherein said correction data previously stored in said correction data memory is data which is used to correct a first-order coefficient and a constant of the output voltage characteristic of each driver means according to a linear equation.

3. The testing apparatus according to claim 2, wherein said correction data previously stored in said correction data memory is previously acquired by digital operation for each channel by means of an initialization program prior to testing of a semiconductor device to be tested and is stored in said correction data memory.

4. The testing apparatus according to claim 2, wherein
   said correction data memory comprises an offset memory for previously storing therein offset data contained in said correction data, and a gain memory for previously storing therein gain data contained in said correction data, said offset data corresponding to said constant and said gain data corresponding to said first-order coefficient; and
   said digital operation means comprises a digital multiplier for multiplying a gain data from said gain memory and a signal voltage from said output level register, and a digital adder for adding the result of multiplication from said digital multiplier and an offset data from said offset memory together or subtracting one from the other.

5. The testing apparatus according to claim 4, wherein said offset memory, said gain memory, said output level register, said load controller, said digital multiplier, said digital adder, a tester processor which exerts centralized control over the whole testing apparatus including peripheral equipment, a data register for storing therein zero volt (0 V) as a fixed value, a selection register for storing therein select information that is used to select, for each channel, whether to output a voltage set in said output level register or to output said zero volt set in said data register, a selector for selecting the output from either said output level register or said data register in response to said select information supplied from said selection register, and an all-pin data setting sequencer for sequentially setting data for all channels are included in the main frame of said testing apparatus;

said multi-channel digital-to-analog converter and said driver means the number of which is equal to that of the channels used are included in the test head of said testing apparatus; and said main frame and said test head are interconnected by said first and said second signal transmission means.

6. The testing apparatus according to claim 1, wherein said correction data previously stored in said correction data memory is data that is used to correct a second-order coefficient, a first-order coefficient, and a constant of the output voltage characteristic of each driver means according to a quadratic equation.

7. The testing apparatus according to claim 6, wherein said correction data previously stored in said correction data memory is previously acquired by digital operation for each channel by means of an initialization program prior to testing of a semiconductor device to be tested and is stored in said correction data memory.

8. The testing apparatus according to claim 6, wherein said correction data memory comprises an offset memory for previously storing therein offset data corresponding to said constant which is contained in said correction data, a second-order coefficient gain memory for previously storing therein gain data corresponding to said second-order coefficient which is contained in said correction data, and a first-order gain memory for previously storing therein gain data corresponding to said first-order coefficient which is contained in said correction data; and said digital operation means comprises a first digital multiplier for multiplying a gain data from said second-order coefficient gain memory and a signal voltage from said output level register, a first digital adder for adding the result of multiplication from said first digital multiplier and a gain data from said first-order coefficient gain memory together or subtracting one from the other, a second digital multiplier for multiplying said signal voltage from said output level register which is supplied to said first digital multiplier and the result of addition/subtraction from said first digital adder, and a second digital adder for adding the result of multiplication from said second digital multiplier and an offset data from said offset memory together or subtracting one from the other.

9. The testing apparatus according to claim 8, wherein said offset memory, said first-order coefficient gain memory, said second-order coefficient gain memory, said output level register, said load controller, said first digital multiplier, said second digital multiplier, said first digital adder, said second digital adder, a tester processor which exerts centralized control over the whole testing apparatus including peripheral equipment, a data register for storing therein zero volt (0 V) as a fixed value, a selection register for storing therein select information that is used to select, for each channel, whether to output a voltage set in said output level register or to output said zero volt set in said data register, a selector for selecting the output from either said output level register or said data register in response to said select information supplied from said selection register, and an all-pin data setting sequencer for sequentially setting data for all channels are included in the main frame of said testing apparatus;

said multi-channel digital-to-analog converter and said driver means the number of which is equal to that of the channels used are included in the test head of said testing apparatus; and said main frame and said test head are interconnected by said first and said second signal transmission means.

10. The testing apparatus according to claim 1, wherein said correction data previously stored in said correction data memory is data that is used to correct an nth-order (n being an integer equal to or larger than 3), an (n−1)th-order, . . . , first-order coefficients and a constant of the output voltage characteristic of each of said driver means according to an nth-order equation.

* * * * *